United States Patent
Dodzin et al.

(10) Patent No.: US 8,498,470 B2
(45) Date of Patent: *Jul. 30, 2013

(54) METHOD AND SYSTEM FOR EVALUATING AN OBJECT

(75) Inventors: Nir Ben-David Dodzin, Hod Hasharon (IL); Vered Gatt, Tel Aviv (IL)

(73) Assignee: Applied Materials Israel, Ltd., Rehovot (IL)

( * ) Notice: Subject to any disclaimer, the term of this patent is extended or adjusted under 35 U.S.C. 154(b) by 0 days.

This patent is subject to a terminal disclaimer.

(21) Appl. No.: 13/585,690

(22) Filed: Aug. 14, 2012

(65) Prior Publication Data

US 2012/0308113 A1 Dec. 6, 2012

Related U.S. Application Data

(63) Continuation of application No. 12/100,334, filed on Apr. 9, 2008, now Pat. No. 8,249,331.

(51) Int. Cl.
*G06K 9/00* (2006.01)

(52) U.S. Cl.
USPC ........... 382/145; 382/141; 382/149; 382/274; 703/13

(58) Field of Classification Search
USPC ..... 382/145, 141, 151, 149; 356/237.1–237.5
See application file for complete search history.

(56) References Cited

U.S. PATENT DOCUMENTS

| | | | |
|---|---|---|---|
| 5,699,447 A | 12/1997 | Alumot et al. | |
| 6,411,377 B1 * | 6/2002 | Noguchi et al. | ........... 356/237.4 |
| 7,065,239 B2 | 6/2006 | Maayah et al. | |
| 7,155,052 B2 * | 12/2006 | Geshel et al. | ................. 382/144 |
| 7,260,256 B2 * | 8/2007 | Hiroi et al. | ..................... 382/141 |
| 7,487,492 B1 * | 2/2009 | Singhal et al. | .................. 716/54 |
| 7,598,490 B2 * | 10/2009 | Kurihara et al. | .............. 250/307 |
| 8,249,331 B2 | 8/2012 | Dodzin et al. | |
| 2004/0070313 A1 | 4/2004 | Furukawa et al. | |
| 2007/0206184 A1 * | 9/2007 | Uto et al. | ................... 356/237.2 |

OTHER PUBLICATIONS

Non-Final Office Action of May 10, 2011 for U.S. Appl. No. 12/100,334: 14 pages.
Final Office Action of Oct. 25, 2011 for U.S. Appl. No. 12/100,334: 11 pages.
Notice of Allowance of Apr. 16, 2012 for U.S. Appl. No. 12/100,334: 13 pages.

* cited by examiner

*Primary Examiner* — Tarifur Chowdhury
*Assistant Examiner* — Isiaka Akanbi
(74) *Attorney, Agent, or Firm* — Kilpatrick Townsend & Stockton LLP

(57) ABSTRACT

A method, system and a computer program product for evaluating a object; the method includes: (i) obtaining an image of an area of the object; wherein the area comprises multiple arrays of repetitive structural elements that are at least partially surrounded by at least one group of non-repetitive regions; wherein non-repetitive regions that belong to a single group of non-repetitive regions are ideally identical to each other; wherein the non-repetitive regions are arranged in a repetitive manner; and
(ii) providing an evaluation result in response to a comparison between image information of a first sub-area to image information of a second sub-area that is proximate to the first sub-area; wherein the first sub-area comprises a first array of repetitive structural elements and a first non-repetitive region; wherein the second subarea comprises a second array of repetitive structural elements and a second non-repetitive region.

13 Claims, 6 Drawing Sheets

8

Obtaining images of an area of the object; wherein the area includes multiple arrays of repetitive structural elements that are at least partially surrounded by at least one group of non-repetitive regions; wherein non-repetitive regions that belong to a single group of non-repetitive regions are ideally identical to each other; wherein the non-repetitive regions are arranged in a repetitive manner. 110

Comparing between image information of the first sub-area and the image information of a second sub-area; wherein the first sub-area includes a first array of memory cells and a first non-repetitive area includes a first stitch; wherein the second sub-area includes a second array of memory cells and a second non-repetitive area that includes a second stitch. 132

Comparing image information of different images of different sub-areas; wherein each image is located at substantially the same position relative to boundaries of a sub-area that includes the image. 134

Comparing between image information of structural elements that are close to an edge of the first array and image information of corresponding elements that are close to a corresponding edge of the second array. 136

Providing an evaluation result in response to a comparison between image information of a first sub-area to image information of a second sub-area that is proximate to the first sub-area; wherein the first sub-area includes a first array of repetitive structural elements and a first non-repetitive region; wherein the second sub-area includes a second array of repetitive structural elements and a second non-repetitive region. 130

100     Figure 4

METHOD AND SYSTEM FOR EVALUATING AN OBJECT

RELATED APPLICATIONS

This application is a CONTINUATION of, claims priority to and incorporates by reference U.S. application Ser. No. 12/100,334 filed Apr. 9, 2008 now U.S. Pat. No. 8,249,331.

FIELD OF THE INVENTION

This invention is generally in the field of automatic inspection of objects such as wafers, masks or reticles for microfabrication, flat panel displays, micro-electromechanical (MEMs) devices and the like.

BACKGROUND OF THE INVENTION

Over the past decade, defect inspection to detect microscopic manufacturing defects has become a standard part of micro-fabrication manufacturing flows, especially for semiconductor wafers.

Each type of inspection technology is usually applied at steps in the semiconductor manufacturing flow where it is best suited to the types of defects most likely to be found. The economic benefits of inspection have been substantial and inspection is generally accepted as having made a significant contribution to the substantial increase in semiconductor wafer manufacturing yields seen in the 1990s.

Inspection systems are employed in a number of different applications including: process monitoring to flag when a particular process step in the manufacturing flow has an increased defect density above the level normally expected at that step; problem solving by inspecting so-called short-loop wafers that have only been processed with a subset of the manufacturing process steps in order to facilitate troubleshooting and diagnosis or optimization of a particular subset of process steps and during process development in order to optimize a new manufacturing process to reduce or eliminate process-specific or systematic defect mechanisms.

Wafer inspection systems for patterned wafer inspection usually work as follows. A high powered microscope, traditionally an optical microscope, but more recently a SEM (Scanning Electron Microscope) or electron microscope, is set up under computer control to acquire sequentially images of the area of objects such as a wafer that include multiple integrated circuits that are arranged in dice, masks or reticles for micro-fabrication, flat panel displays, micro-electromechanical (MEMs) devices and the like during and after manufacture.

The image or contrast data that is acquired in this manner is then compared to reference data. Defects are found or detected where there are differences between the reference and the acquired images. The reference images may be derived from Computer Aided Design data as is often the case with mask or reticle inspection. Additionally or alternatively, the reference images may simply be images of neighboring cells or die on the wafer or similar wafer being inspected. The sensitivity of the defect inspection process to small defects can be controlled by adjusting the image acquisition parameters such as pixel size, contrast, brightness, charging and bias conditions etc., and image processing parameters that are used to compare the acquired inspection images and reference images.

An object such as a wafer can include repetitive regions that include many repetitive structural elements such as memory cells (such as SRAM, DRAM, FRAM, Flash memory). Repetitive regions can also include repetitive structural elements programmable logic cells such as those included in PLAs, PLDs. Yet other objects such as MEMs displays and flat panel displays can include repetitive regions.

Typically, ideally identical structural elements (referred to as cells) that are included within the same repetitive region are compared to each other or to a so-called "golden cell". Both types of comparison are known as cell to cell comparison.

Memory arrays are often surrounded by non-repetitive regions. These non-repetitive regions are commonly compared to each other using a so-called die to die comparison.

Die to die comparison involves comparing image information of one die to image information of another die. It is known in the art that die to die comparison is significantly less sensitive to defects due to its reduced sensitivity in relation to cell to cell comparison. The latter has advantages over die to die comparison because it is less sensitive to process variations, color variations (a phenomena that occurs when bright field technology is applied and when a partially transparent layer is positioned above the cells), and to changes in the optical image acquisition (and/or illumination) process. These changes can include radiation intensity fluctuations, optics aberrations; focus related inaccuracies, sensor saturation, sensor array un-uniformity, misalignment, and the like.

Even cell to cell comparison has some disadvantages. It is responsive to differences between the acquisition of image information of cells that are close to the edges of the repetitive regions and the acquisition of image information of cells that are spaced apart from the edges of the repetitive regions. It is noted that image information of a certain structural element can be affected by the surrounding of that certain structural element due to relatively wide energy distribution of radiation that is used to illuminate the area and as a result of pattern information that passes through spatial filters when illuminating structural elements that are near the edge of the array. Typically, such spatial filters are adapted to block interference lobes of an array of repetitive structural elements. Non-repetitive regions can alter the location of the interference lobes thus pattern information can pass through these spatial filters.

FIG. 1 illustrates area 8 of a prior art wafer. Multiple memory cell arrays 10-18 are surrounded by vertical stitches (denoted V) and horizontal stitches (denoted "H stitch" 20-30). During a commonly implemented hybrid comparison process image information of repetitive structural elements within each array is compared to image information of repetitive structural elements within the same array while image information of vertical stitches are compared to image information of vertical stitches of another die. This hybrid comparison process suffers from the mentioned above drawbacks of die to die comparison and from the drawbacks of cell to cell comparison.

There is a growing need to provide improved systems, methods and computer program products that can evaluate an object.

SUMMARY OF THE INVENTION

A method for evaluating a object; the method includes: (i) obtaining an image of an area of the object; wherein the area comprises multiple arrays of repetitive structural elements that are at least partially surrounded by at least one group of non-repetitive regions; wherein non-repetitive regions that belong to a single group of non-repetitive regions are ideally identical to each other; wherein the non-repetitive regions are arranged in a repetitive manner; and (ii) providing an evaluation result in response to a comparison between image information of a first sub-area to image information of a second sub-area that is proximate to the first sub-area; wherein the first sub-area comprises a first array of repetitive structural elements and a first non-repetitive region; wherein the second sub-area comprises a second array of repetitive structural elements and a second non-repetitive region.

A system for evaluating an object; the system comprises: a memory unit adapted to store an image of an area of the object; wherein the area comprises multiple arrays of repetitive structural elements that are at least partially surrounded by at least one group of non-repetitive regions; wherein non-repetitive regions that belong to a single group of non-repetitive regions are ideally identical to each other; wherein the non-repetitive regions are arranged in a repetitive manner; and a processor adapted to provide an evaluation result in response to a comparison between image information of a first subarea to image information of a second sub-area that is proximate to the first sub-area; wherein the first sub-area comprises a first array of repetitive structural elements and a first non-repetitive region; wherein the second sub-area comprises a second array of repetitive structural elements and a second non-repetitive region.

A computer program product comprising a computer useable medium having a computer readable program, wherein the computer readable program, when executed on a computer, causes the computer to: receive an image of an area of the object; wherein the area comprises multiple arrays of repetitive structural elements that are at least partially surrounded by at least one group of non-repetitive regions; wherein non-repetitive regions that belong to a single group of non-repetitive regions are ideally identical to each other; wherein the non-repetitive regions are arranged in a repetitive manner; and provide an evaluation result in response to a comparison between image information of a first sub-area to image information of a second sub-area that is proximate to the first sub-area; wherein the first sub-area comprises a first array of repetitive structural elements and a first non-repetitive region; wherein the second subarea comprises a second array of repetitive structural elements and a second non-repetitive region.

BRIEF DESCRIPTION OF THE DRAWINGS

In order to understand the invention and to see how it may be carried out in practice, an embodiment will now be described, by way of non-limiting example only, with reference to the accompanying drawings, in which:

FIG. 4 illustrates a method according to an embodiment of the invention;

DETAILED DESCRIPTION

Figure 1:
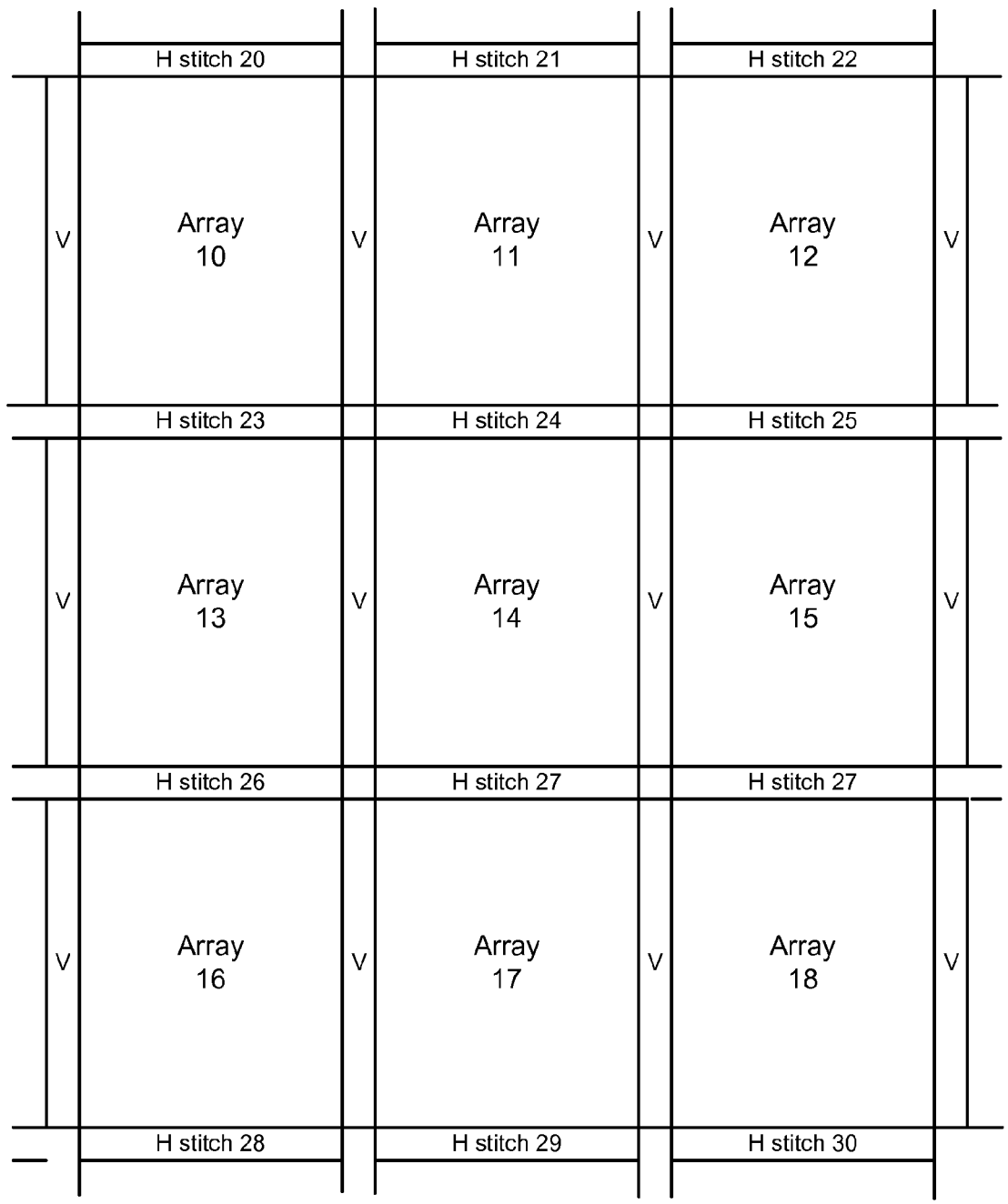
FIG. 1 illustrates an area of a wafer.

A method, system and computer program product for evaluating an object such as a wafer, a mask or reticles for micro-fabrication, flat panel displays, micro-electromechanical (MEMs) devices and the like during or after manufacture.

According to an embodiment of the invention sub-areas are defined. Each subarea includes an array of repetitive structural elements. The array of repetitive structural elements is surrounded by at least one group of non-repetitive regions. Non-repetitive regions that belong to a single group of non-repetitive regions are ideally identical to each other. The non-repetitive regions are arranged in a repetitive manner. Instead of did to die comparison the method, system and computer program product apply another comparison. This comparison is made between image information of non-repetitive regions that belong to sub-areas (usually of the same die) that are proximate to each other. This type of comparison is more robust as it is less affected by process variations, color variations or changes in image acquisition conditions.

According to an embodiment of the invention instead of comparing image information of the one structural element of an array of repetitive patterns to image information of another structural element of the same array of repetitive structural elements, image information of a repetitive structural element of a first sub-area is compared to image information of a corresponding repetitive structural element of second sub-area. This comparison overcomes comparison errors that result from comparing image information of structural elements that are located near the edge of an array of repetitive structural elements to image information of structural elements that are located away from the edge of the array of repetitive structural elements.

Yet according to another embodiment of the invention an array of repetitive elements is separated to an inner portion and to an outer portion. The outer portion can be located between the inner portion and the non-repetitive regions that surround the array of repetitive structural elements. The inner portion includes structural elements that are selected so that their image information is not affected from the non-repetitive regions while image information of structural elements of the outer portion can be affected by the non-repetitive regions. Image information of a structural element within the inner portion of an array of repetitive structural elements is compared to image information of another structural element within the same inner portion. Image information of structural elements within the outer portion of an array of repetitive structural elements that belongs to a certain sub-area are compared to corresponding image information of structural elements within the outer portion of another array of repetitive structural elements that belongs to another sub-area.

Unless stated otherwise, terms such as "first" and "second" are used to arbitrarily distinguish between the elements such terms describe. Thus, these terms are not necessarily intended to indicate temporal or other prioritization of such elements.

Unless states otherwise the term "corresponding structural elements" means structural elements that belong to different sub-areas that are positioned at substantially the same position in relation to the boundaries of the sub-areas to which they belong.

The term "image information" means information that describes information obtained during the optical acquisition of an image. Typically this information include one or more gray level pixel but this is not necessarily so. It is noted that the image information can be acquired by using imaging optics or non-imaging optics. Image information can be digitally processed (for example by applying filters) before being compared to other image information.

Figure 2:
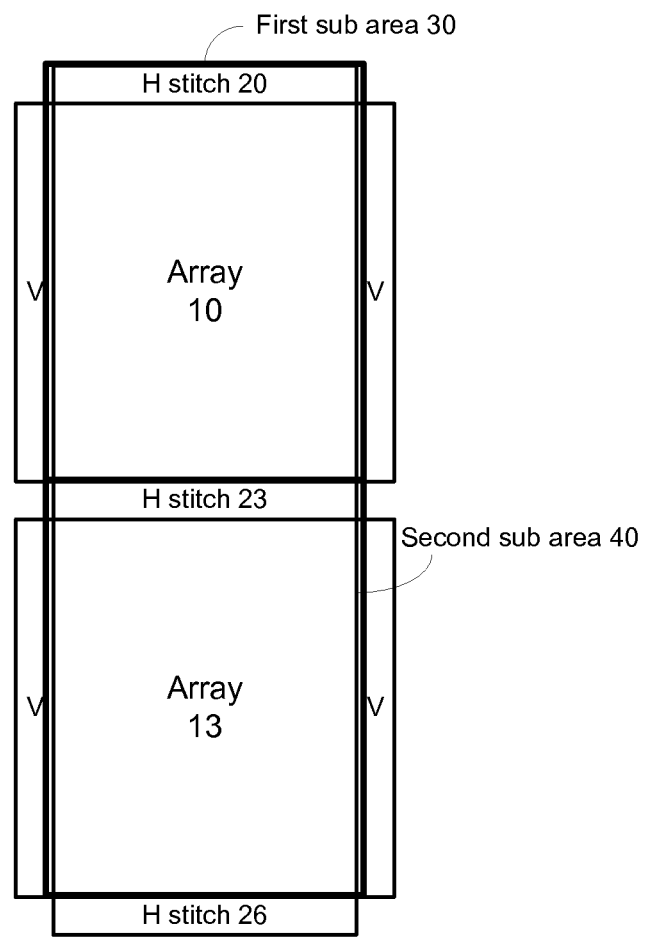
FIG. 2 illustrates two sub-areas according to an embodiment of the invention.

FIG. 2 illustrates Mo sub-areas according to an embodiment of the invention. Image information of a first sub-area is compared to corresponding image information of a second sub-area. FIG. 2 illustrates consecutive sub-areas. It is noted that image information comparison can be made between sub-areas that are proximate to each other even if these sub-areas are spaced apart from each other. Referring to the example set fourth in FIG. 1, a sub-area that includes array 10 and horizontal stitch 20 can be compared to another sub-area the includes array 18 and horizontal stitch 27. It is noted that the image information of a first-sub area can be compared to information representative of multiple other sub-areas. This can include a comparison to information of a first sub-area to an average (or other statistical or on-statistical function) of multiple other sub-areas.

Two sub-areas can be regarded as proximate if the expected variations between these areas due to process variation are below a certain process variation threshold. Additionally or alternatively, two sub-areas can be regarded as proximate if the affect of color variations, temporal changes in the optical image acquisition and/or illumination process on comparison process is below a certain threshold. Each of these thresholds can be set by a user, evaluation tool operator or object manufacturer in response to various parameters such as required sensitivity, required signal to noise ratio, expected defects to be detected and the like. Typically sub-areas are regarded as proximate to each other if the distance between these sub-areas does not exceed a fraction of the length (or width) of a die.

FIG. 4 illustrates method 100 for evaluating an object according to an embodiment of the invention.

Method 100 starts by stage 110 of obtaining an image of an area of the object; wherein the area includes multiple arrays of repetitive structural elements that are at least partially surrounded by at least one group of non-repetitive regions. Non-repetitive regions that belong to a single group of non-repetitive regions are ideally identical to each other. Non-repetitive regions are arranged in a repetitive manner.

It is noted that the area can be much smaller than a die, can include one or more dice, and the like.

Referring to the example set fourth in FIG. 2, the arrays of repetitive structural elements are array 10 and array 13. The first group of non-repetitive regions include horizontal stitches 20, 23 and 26 while the second group of non-repetitive regions includes vertical stitches (denoted V).

Stage 110 can include optically (including using electron optics) obtaining these images, obtaining image information representative of these images and the like. It is noted that an image of an area such as area 8 of FIG. 1 can involve taking images of portions of area 8 and generating a synthetic image that includes portions of multiple separate optically acquired images. It is further noted that the optical acquisition of an image can require alignment. Alignment is typically much easier (and less time consuming) when done per sub-area. It is noted that optically obtained images of portions of an area can partially overlap in order to compensate for various misalignment problems associated with the optically acquisition of images. It is further noted that the image of area 8 can be generated after acquiring multiple images of that area and processing these images (for example—by summing these images in order to average out random noise). Those of skill in the art will appreciate that the image can be acquired by using monochromatic radiation, a charged particle beam, broadband radiation, a pulsed light source, a continuous light source and the like.

Stage 110 is followed by stage 130 of providing an evaluation result in response to a comparison between image information of a first sub-area to image information of a second sub-area that is proximate to the first sub-area. The first sub-area includes a first array of repetitive structural elements and a first non-repetitive region. The second subarea includes a second array of repetitive structural elements and a second non-repetitive region. It is noted that each sub-area can include one or more portions of one or more non-repetitive regions.

Conveniently, stage 130 includes at least one stage out of stages 132, 134 and 136.

Stage 132 includes comparing between image information of the first sub-area and the image information of a second sub-area wherein the first sub-area includes a first array of memory cells and a first non-repetitive area includes a first stitch. The second sub-area comprises a second array of memory cells and a second non-repetitive area includes a second stitch. FIG. 2 provides an example of such sub areas.

Stage 134 includes comparing image information of corresponding structural elements of different sub-areas. Each structural element is located at substantially the same position relative to boundaries of a sub-area that includes the structural element. Stage 134 includes, for example: (i) comparing image information of repetitive structural elements that belong to a first sub area and are not located near the edge of their array to corresponding structural elements of a second sub area that are not located near the edge of another array, and (ii) comparing image information of structural elements of a non-repetitive region of a first sub area to corresponding structural elements of another non-repetitive region of a second sub area.

Stage 136 includes comparing between image information of structural elements that are close to an edge of the first array and image information of corresponding elements that are close to a corresponding edge of the second array. It is noted that stage 134 can be regarded as including stage 136 but this is not necessarily so.

Figure 3:
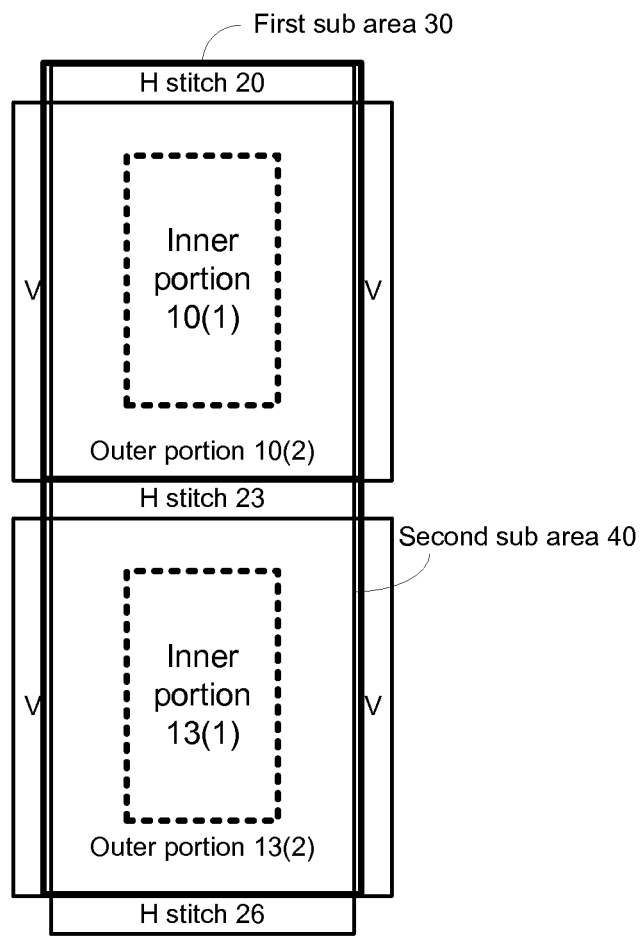
FIG. 3 illustrates Mo sub-areas according to another embodiment of the invention.

FIG. 3 illustrates two sub-areas according to another embodiment of the invention.

FIG. 3 illustrates that each array out of arrays 10 and 13 was partitioned to an inner portion (10(1) and 13(1) respectively) and an outer portion (10(3) and 13(3) respectively). An outer region includes structural elements that their image information is affected (at least above a certain threshold) from one or more non-repetitive region that surround its array. An inner region includes structural elements that their image information is not affected (or is affected below the certain threshold) by a non-repetitive region. It is noted that the threshold can represent a balance between the characteristics of cell to cell comparison and those of sub area to sub area comparison.

Figure 5:
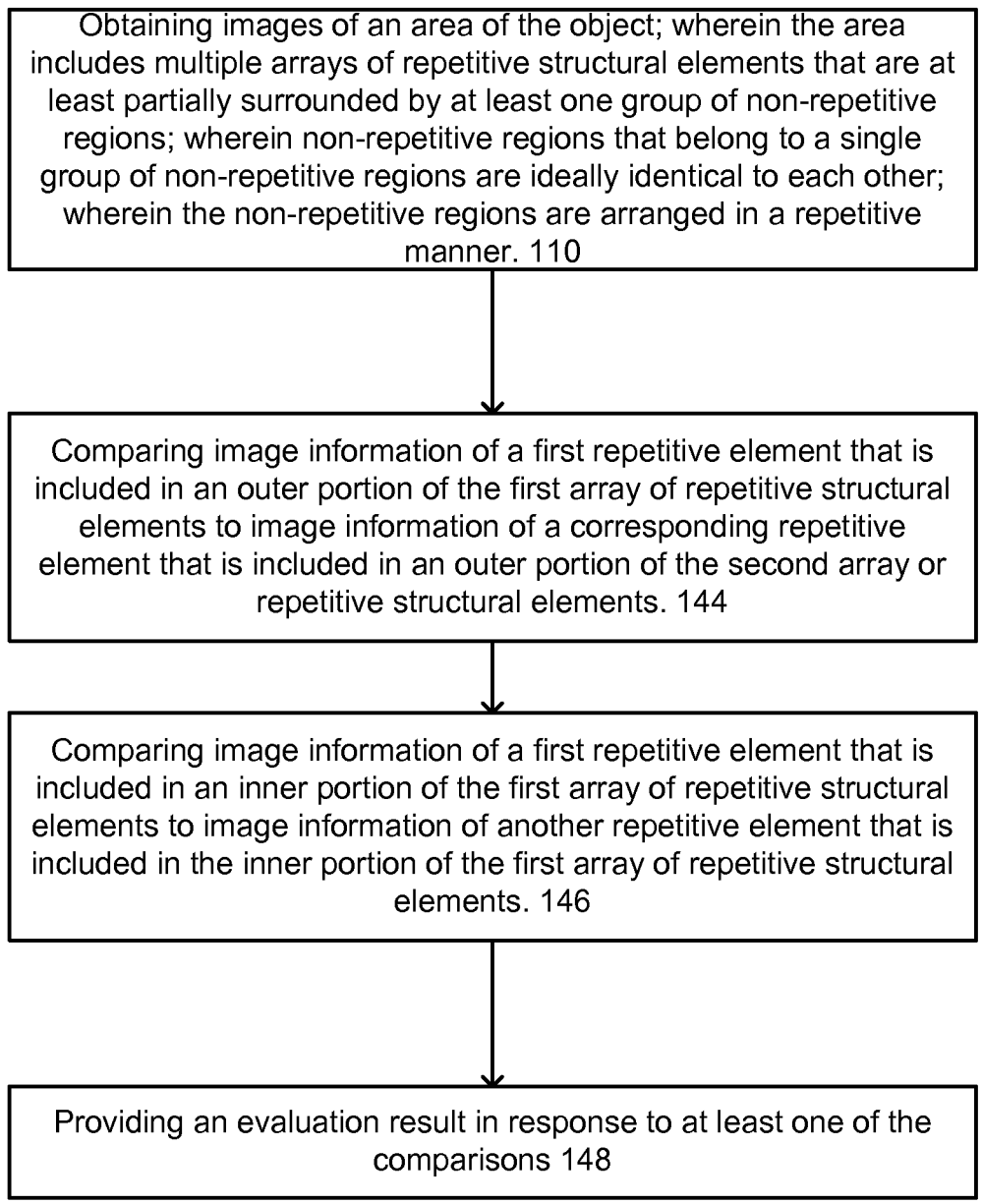
FIG. 5 illustrates a method according to another embodiment of the invention.

FIG. 5 illustrates method 200 according to an embodiment of the invention.

Method 200 starts by stage 110 of obtaining an image of an area of the object; wherein the area includes multiple arrays of repetitive structural elements that are at least partially surrounded by at least one group of non-repetitive regions; wherein non-repetitive regions that belong to a single group of non-repetitive regions are ideally identical to each other; wherein the non-repetitive regions are arranged in a repetitive manner.

Stage 110 is followed by stages 144 and 146. These stages can be executed in parallel to each other but for simplicity of explanation FIG. 5 illustrates stage 144 as being followed by stage 146.

Stage 144 includes comparing image information of a first repetitive element that is included in an outer portion of the first array of repetitive structural elements to image information of a corresponding repetitive element that is included in an outer portion of the second array of repetitive structural elements. The first array belongs to a first sub area and the second array belongs to a second sub area. The first and second sub areas are proximate to each other.

Stage 146 includes comparing image information of a first repetitive element that is included in an inner portion of the first array of repetitive structural elements to image information of another repetitive element that is included in the inner portion of the first array of repetitive structural elements.

Stage 146 is followed by stage 148 of providing an evaluation result in response to at least one of the comparisons of stage 144 and 146.

Figure 6:
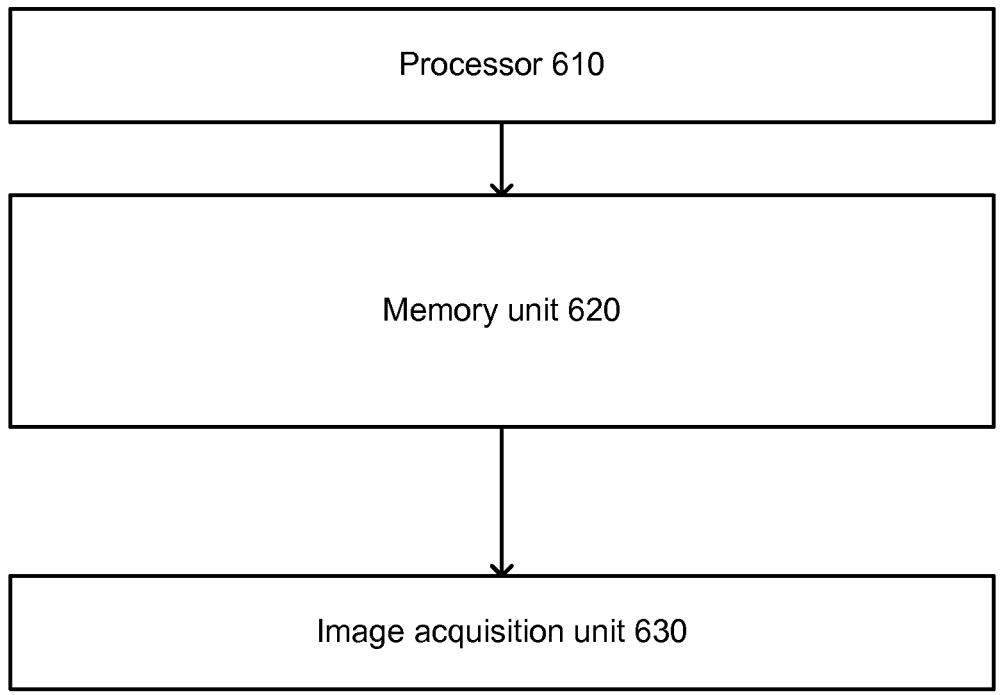
FIG. 6 illustrates a system according to an embodiment of the invention.

FIG. 6 illustrates system 300 according to an embodiment of the invention.

System 300 includes memory unit 320, processor 310 and image acquisition unit 330. System 300 can optically obtain an image of an area or can receive images (or information representative of such images) from inspection tool that include an image acquisition unit.

Memory unit 320 is adapted to store an image of an area of the object. The area includes multiple arrays of repetitive structural elements that are at least partially surrounded by at least one group of non-repetitive regions; wherein non-repetitive regions that belong to a single group of non-repetitive regions are ideally identical to each other; wherein the non-repetitive regions are arranged in a repetitive manner.

Processor 310 is adapted to provide an evaluation result in response to a comparison between image information of a first sub-area to image information of a second sub-area that is proximate to the first sub-area; wherein the first sub-area includes a first array of repetitive structural elements and a first non-repetitive region; wherein the second sub-area includes a second array of repetitive structural elements and a second non-repetitive region.

Conveniently, processor 310 is adapted to compare between image information of the first sub-area and the image information of a second sub-area; wherein the first sub-area includes a first array of memory cells and a first non-repetitive area includes a first stitch; wherein the second sub-area includes a second array of memory cells and a second non-repetitive area that includes a second stitch.

Conveniently, processor 310 is adapted to compare image information of different structural elements of different sub-areas; wherein each structural element is located at substantially the same position relative to boundaries of a sub-area that includes the structural element.

Conveniently, processor 310 is adapted to compare between image information of structural elements that are close to an edge of the first array of repetitive structural elements and image information of corresponding elements that are close to a corresponding edge of the second array.

Conveniently, processor 310 is adapted to compare image information of a first repetitive element that is included in an outer portion of the first array of repetitive structural elements to image information of a corresponding repetitive element that is included in an outer portion of the second array of repetitive structural elements.

Conveniently, processor 310 is adapted to compare image information of a first repetitive element that is included in an inner portion of the first array of repetitive structural elements to image information of another repetitive element that is included in the inner portion of the first array of repetitive structural elements.

Conveniently, a computer program product is provided. It includes a computer useable medium having a computer readable program, wherein the computer readable program, when executed on a computer, causes the computer to: receive an image of an area of the object; wherein the area comprises multiple arrays of repetitive structural elements that are at least partially surrounded by at least one group of non-repetitive regions; wherein non-repetitive regions that belong to a single group of non-repetitive regions are ideally identical to each other; wherein the non-repetitive regions are arranged in a repetitive manner; and provide an evaluation result in response to a comparison between image information of a first sub-area to image information of a second sub-area that is proximate to the first sub-area; wherein the first sub-area comprises a first array of repetitive structural elements and a first non-repetitive region; wherein the second sub-area comprises a second array of repetitive structural elements and a second non-repetitive region.

Conveniently, the computer program product causes the computer to compare between image information of the first sub-area and the image information of a second sub-area; wherein the first sub-area comprises a first array of memory cells and a first non-repetitive area comprises a first stitch; wherein the second sub-area comprises a second array of memory cells and a second non-repetitive area that comprises a second stitch.

Conveniently, the computer program product causes the computer to compare image information of different structural elements of different sub-areas; wherein each structural element is located at substantially the same position relative to boundaries of a sub-area that comprises the structural element.

[Conveniently, the computer program product causes the computer to compare between image information of structural elements that are close to an edge of the first array of repetitive structural elements and image information of corresponding elements that are close to a corresponding edge of the second array of repetitive structural elements.

Conveniently, the computer program product causes the computer to compare image information of a first repetitive element that is included in an outer portion of the first array of repetitive structural elements to image information of a corresponding repetitive element that is included in an outer portion of the second array of repetitive structural elements.

Conveniently, the computer program product causes the computer to compare image information of a first repetitive element that is included in an inner portion of the first array of repetitive structural elements to image information of another repetitive element that is included in the inner portion of the first array of repetitive structural elements.

It is noted that although the above text refers to a comparison between image information of structural elements of two sub areas that multiple comparison between structural elements of more than two different sub areas can be performed. For example, if there is a difference between image information of two ideally identical corresponding structural elements of two sub areas then at least one additional comparison can be made in order to determine which structural element out of the first two that were compared is defective.

It is further noted that the method, system and computer program product can be applied mutatis mutandis to a comparison between image information of a sub area to image information of a "golden" sub area. Thus, image information of a first sub area can be compared to image information of a second sub area.

Those skilled in the art will readily appreciate that various modifications and changes can be applied to the embodiments of the invention as hereinbefore described without departing from its scope defined in and by the appended claims.

What is claimed is:
1. A method for evaluating one or more dice, the method comprising:
obtaining, using an imaging device, an image of an area of the one or more dice, the area of the dice comprising multiple arrays of repetitive structural elements that are at least partially surrounded by one or more groups of non-repetitive regions, wherein for each subject group of non-repetitive regions, non-repetitive regions of the subject group are arranged in a repetitive manner; and comparing image information of a first sub-area of the area to image information of a second sub-area of the area that is proximate to the first sub-area, the first sub-area comprising a first array of the multiple arrays of repetitive structural elements and a first non-repetitive region and the second sub-area comprising a second array of the multiple arrays of repetitive structural elements and a second non-repetitive region; and responsive to the comparing, providing an evaluation result indicative of whether or not defects are present in the sub-areas that were compared.

2. The method according to claim 1 wherein the first sub-area and the second sub-area comprise sub-areas of an area of a single die.

3. The method according to claim 1 wherein the image information of the first and second sub-areas comprise image information of structural elements of the respective sub-areas, each structural element of each respective-sub-area located at a substantially similar position within the respective sub-area relative to boundaries of the respective sub-area.

4. The method according to claim 1 further comprising, if a result indicative of a defect is obtained, performing at least one additional comparison of image information of the first and second sub-areas.

5. The method according to claim 1 wherein the image information of the first or second sub-area comprises image information of a repetitive element that is included in an outer portion of an array of repetitive structural elements.

6. The method according to claim 1 wherein the image information of the first of second sub-area comprises image information of a repetitive element that is included in an inner portion of an array of repetitive structural elements.

7. A system for evaluating an object, the system comprising a computer-readable storage device storing instructions for execution by a processor; and a processor communicatively coupled to the storage device and adapted to execute the instructions stored by the storage device, said instructions for causing said processor to:

obtain an image of an area of one or more dice, the area of the dice comprising multiple arrays of repetitive structural elements that are at least partially surrounded by one or more groups of non-repetitive regions, wherein for each subject group of non-repetitive regions, non-repetitive regions of the subject group are arranged in a repetitive manner; and compare image information of a first sub-area of the area to image information of a second sub-area of the area that is proximate to the first sub-area, the first sub-area comprising a first array of the multiple arrays of repetitive structural elements and a first non-repetitive region and the second sub-area comprising a second array of the multiple arrays of repetitive structural elements and a second non-repetitive region; and responsive to the comparing, provide an evaluation result indicative of whether or not defects are present in the sub-areas that were compared.

8. The system according to claim 7 wherein the first sub-area and the second sub-area comprise sub-areas of an area of a single die.

9. The system according to claim 7 wherein the image information of the first and second sub-areas comprise image information of structural elements of the respective sub-areas, each structural element of each respective-sub-area located at a substantially similar position within the respective sub-area relative to boundaries of the respective sub-area.

10. The method according to claim 7 further comprising, if a result indicative of a defect is obtained, the instructions further cause the processor to perform at least one additional comparison of image information of the first and second sub-areas.

11. The method according to claim 7 wherein the image information of the first or second sub-area comprises image information of a repetitive element that is included in an outer portion of an array of repetitive structural elements.

12. The method according to claim 7 wherein the image information of the first or second sub-area comprises image information of a repetitive element that is included in an inner portion of an array of repetitive structural elements.

13. The system according to claim 7 further comprising an image acquisition unit communicatively coupled to the processor and adapted to obtain the image information.

* * * * *